(12) United States Patent
Nakanishi et al.

(10) Patent No.: US 7,800,140 B2
(45) Date of Patent: Sep. 21, 2010

(54) SEMICONDUCTOR INTEGRATED CIRCUIT

(75) Inventors: Kazuyuki Nakanishi, Osaka (JP);
Hidetoshi Nishimura, Osaka (JP);
Tomoaki Ikegami, Kyoto (JP)

(73) Assignee: Panasonic Corporation, Osaka (JP)

( * ) Notice: Subject to any disclaimer, the term of this patent is extended or adjusted under 35 U.S.C. 154(b) by 54 days.

(21) Appl. No.: 12/048,837

(22) Filed: Mar. 14, 2008

(65) Prior Publication Data

US 2008/0224176 A1 Sep. 18, 2008

(30) Foreign Application Priority Data

Mar. 16, 2007 (JP) .............................. 2007-068947

(51) Int. Cl.
*H01L 27/10* (2006.01)

(52) U.S. Cl. .................. 257/213; 257/202; 257/E27.07

(58) Field of Classification Search .................. 257/213, 257/202

See application file for complete search history.

(56) References Cited

U.S. PATENT DOCUMENTS

| | | | |
|---|---|---|---|
| 6,194,252 B1 | 2/2001 | Yamaguchi | |
| 6,521,969 B1 | 2/2003 | Tomita | |
| 7,137,092 B2 | 11/2006 | Maeda | |
| 2004/0243967 A1 | 12/2004 | Yamagiwa et al. | |
| 2005/0132314 A1* | 6/2005 | Chen et al. | 716/9 |
| 2005/0280031 A1* | 12/2005 | Yano | 257/202 |
| 2006/0136848 A1* | 6/2006 | Ichiryu et al. | 716/1 |
| 2006/0138462 A1 | 6/2006 | Choi | |
| 2006/0199325 A1* | 9/2006 | Maeno et al. | 438/199 |
| 2006/0271902 A1 | 11/2006 | Yamashita et al. | |
| 2007/0164332 A1* | 7/2007 | Paik et al. | 257/292 |

FOREIGN PATENT DOCUMENTS

| | | |
|---|---|---|
| JP | 10-32253 | 2/1998 |
| JP | 2006-332348 | 12/2006 |
| JP | 2007-12855 | 1/2007 |

* cited by examiner

*Primary Examiner*—Zandra Smith
*Assistant Examiner*—Lawrence Tynes, Jr.
(74) *Attorney, Agent, or Firm*—McDermott Will & Emery LLP

(57) ABSTRACT

A semiconductor integrated circuit is provided which entails no increase in the correction time of OPC and in which non-uniformity in the gate lengths due to the optical proximity effects is surely suppressed. A plurality of standard cells (C1, C2, C3, . . . ), each including gates G extended in the vertical direction, are aligned in the transverse direction to form a standard cell row. A plurality of the standard cell rows are located side by side in the vertical direction to form a standard cell group. Each of the standard cell rows has a terminal standard cell Ce at least one end of the standard cell row. The terminal standard cell Ce includes two or more supplementary gates, each of which is any of a dummy gate and a gate of an inactive transistor.

16 Claims, 10 Drawing Sheets

(a)    (b)

SEMICONDUCTOR INTEGRATED CIRCUIT

CROSS-REFERENCE TO RELATED APPLICATIONS

This application claims priority under 35 U.S.C. §119(a) on Japanese Patent Application No. 2007-68947 filed on Mar. 16, 2007, the entire contents of which are hereby incorporated by reference.

BACKGROUND OF THE INVENTION

1. Field of the Invention

The present invention relates to a semiconductor integrated circuit which is effective in suppressing the optical proximity effects.

2. Description of the Related Art

The following terms used in the present specification shall have the following meanings.

"Active transistor" refers to a transistor which contributes to a desired function of a circuit using its operational characteristics. "Inactive transistor" refers to a transistor which does not contribute to a desired function of a circuit. Non-uniformity in gate shape of inactive transistors does not affect the desired function of the circuit. "Transistor" can refer to any of an active transistor and an inactive transistor.

Typical examples of the inactive transistor include: a P-channel transistor whose gate potential is fixed to the supply potential, or N-channel transistor whose gate potential is fixed to the ground potential, and which is maintained in an OFF state (hereinafter, referred to as "off-transistor"); a P-channel transistor whose gate potential is fixed to the ground potential and whose source and drain potentials are fixed to the supply potential, or N-channel transistor whose gate potential is fixed to the supply potential and whose source and drain potentials are fixed to the ground potential, and which is employed as a capacitor between the power supply and the ground (hereinafter, referred to as "capacitance transistor"); a transistor whose source and drain potentials are fixed to an equal potential such that no current flows; and a transistor which serves to maintain the drain potential equal to the supply potential or ground potential (hereinafter, referred to as "potential-fixing transistor").

"Gate" refers to part of a transistor formed of polysilicon, or the like, which is functionally combined with a diffusion region to constitute the transistor or refers to a "dummy gate" which is not a constituent of a transistor.

Hereinafter, a transistor, a typical standard cell formed using the transistor, and a semiconductor integrated circuit formed using the standard cell are described in this order with reference to the drawings.

FIG. 15A shows a P-type transistor Tp which is formed by P-type diffusion regions Dp, a gate G, and an N-type well NW. FIG. 15B shows an N-type transistor Tn which is formed by N-type diffusion regions Dn, a gate G, and a P-type well PW. The gate G of the transistors, which is made of materials including polysilicon and other components, is sandwiched by the diffusion regions Dp (or Dn). The source and drain of the transistors are formed by the diffusion regions Dp (or Dn). Throughout the drawings, the gate width of the gate G is denoted by "W", and the gate length of the gate G is denoted by "L". With varying gate widths W and gate lengths L, a variety of transistor characteristics are acquired as desired.

FIG. 16 shows a standard cell formed using the transistors of FIG. 15A and FIG. 15B. Referring to FIG. 16, the standard cell C includes: a diffusion region Dbn for supplying a substrate potential to P-type transistors Tp1 and Tp2, N-type transistors Tn1 and Tn2, and P-type transistors Tp1 and Tp2; a diffusion region Dbp for supplying the substrate potential to the N-type transistors Tn1 and Tn2; a metal line Mvdd for supplying a supply potential to the sources of the P-type transistors Tp1 and Tp2; a metal line Mvss for supplying a ground potential to the sources of the N-type transistors Tn1 and Tn2; and an N-type well NW and a P-type well PW. The distance between the gates of the transistors is denoted by "S". It should be noted that the diffusion regions of the transistors, the gate G, gate width W and gate length L are not indicated in FIG. 16 in order to avoid repeating the descriptions of FIG. 15. The standard cell C shown in FIG. 16 is a typical standard cell example and, however, various other standard cells are possible with flexible arrangements and wirings of transistors having various shapes.

FIG. 17 shows a semiconductor integrated circuit including a plurality of standard cells. As shown in FIG. 17, the standard cells (C1, C2, C3, ...) are adjacently aligned in a direction perpendicular to the direction in which the gates of their transistors are extended, thereby forming a standard cell row. (Hereinafter, the direction in which the gates are extended is referred to as "vertical direction" for convenience of description, and the direction perpendicular to the vertical direction is referred to as "transverse direction".) A plurality of such standard cell rows are located side by side in the vertical direction, which are interconnected to one another to realize an LSI having a desired function. In this process, the standard cells are located such that the N-type wells NW, P-type wells PW, diffusion regions Dbn, diffusion regions Dbp, metal lines Mvdd and metal lines Mvss (none of which are shown) of the respective standard cells are common among or adjoining between the standard cells and therefore have shapes extended in the transverse direction without discontinuity.

Hereinafter, disadvantages resulting from non-uniformity in the gate dimensions of the transistors in this semiconductor integrated circuit are described.

The primary factors in variation of propagation delay time in the semiconductor integrated circuits include the operation supply voltage, temperature, and process variations. The semiconductor integrated circuits need to be designed such that the operation of the circuits can be secured even when all the factors in the variation are in the worst conditions. Especially, the gate length of a transistor is an important factor in definition of the operation of the transistor, and the influence of non-uniformity in the gate lengths constitutes considerably large part of the process variations. In recent years, as the miniaturization of transistors has been advanced, the gate length has been further decreasing so that the gate length non-uniformity constitutes a larger proportion in general. Therefore, the design margins need to be increased as the variation of the propagation delay time increase. Thus, it is difficult to provide a high-performance semiconductor integrated circuit.

In a typical manufacture process of semiconductor integrated circuits, the photolithography step including resist application, exposure and development, the etching step for patterning of elements with resist masks, and the resist removal step are repeated to form an integrated circuit on a semiconductor substrate. The formation process of the gates of transistors also includes the photolithography step, the etching step, and the resist removal step. In exposure at the photolithography step, pattern dimensions equal to or smaller than the exposure wavelength result in large errors between the layout dimensions defined at the time of designing and the pattern dimensions on a manufactured semiconductor substrate due to the optical proximity effects produced by diffracted light.

In manufacture of a semiconductor integrated circuit, in patterning of wirings and other elements via drawing or exposure, corrections for improvement in dimension accuracy of the pattern are indispensable for preventing occurrence of optical proximity effects. One of the techniques of correcting the optical proximity effects is OPC (Optical Proximity effect Correction). According to the OPC, a gate length non-uniformity resulting from the optical proximity effects is estimated from the distance between a gate and another gate pattern adjacent to the gate, and the mask value of a photoresist used for formation of the gate is corrected in advance such that the non-uniformity is compensated for, whereby the gate length value of a gate actually formed after exposure is maintained constant.

On the other hand, the OPC performed on the gate mask can disadvantageously increase the delay of TAT (Turn Around Time) and the amount of process efforts. Especially because the gate pattern has not conventionally been standardized and the gate length and gate interval are thus varying over a whole chip, the corrections based on the OPC technique have been requiring a huge amount of process efforts.

To avoid such a disadvantage, it has been proposed to limit the variety of gate length and gate interval to one or several optional values in the layout process. With this proposed solution, the gate length value of a gate actually formed can be maintained constant by designing circuits using a limited number of gate length values or inserting dummy gates for achieving uniform gate intervals, without gate mask corrections based on OPC. Thus, non-uniformity in the gate lengths due to the optical proximity effects can be suppressed.

FIG. 18 shows a standard cell example which is designed to be used when the gate length and gate interval are respectively limited to one option. In the standard cell of FIG. 18, the transistor gates G1, G2, . . . and G8 have equal gate length L and are located with constant gate intervals S. Namely, to suppress non-uniformity in the gate lengths among the gates G2, G3, G6 and G7 of the active transistors due to the optical proximity effects, the standard cell is furnished with the dummy gates G1, G4, G5 and G8 such that the gate intervals and the gate lengths are uniform.

FIG. 19 shows a conventional semiconductor integrated circuit which is designed using such standard cells as shown in FIG. 18. Referring to FIG. 19, the standard cells (C1, C2, C3, . . . ) are arranged in the transverse direction such that the dummy gates are shared at the borders between the standard cells. Since all the active transistors in the semiconductor integrated circuit have equal gate lengths and same gate intervals, the gate length value of the gates actually formed can be maintained constant, and therefore, the non-uniformity in the gate lengths due to the optical proximity effects can be suppressed.

Known technology documents, prior to the present application, in the art fields the inventions of the present application relate to are as follows:

(Patent Document 1) Japanese Laid-Open Patent Publication No. 10-32253

(Patent Document 2) Specification of U.S. Pat. No. 7,137,092

(Patent Document 3) Japanese Laid-Open Patent Publication No. 2007-12855

As described above, the finer dimensions of the transistors have been accompanied by shortening of the gate lengths, resulting in larger influence of the optical proximity effects due to diffracted light in gate exposure. In addition, the influence of the optical proximity effects disadvantageously varies according to the patterns surrounding the gates.

For example, in the semiconductor integrated circuit shown in FIG. 19, the gate of a centrally-located active transistor is accompanied by two or more neighboring gates located on the both sides. Specifically, the gate Ga, for example, is accompanied by the gates Ga1 and Ga2 on the left side and by the gates Ga3 and Ga4 on the right side. On the other hand, the gate of an active transistor located at an end of a standard cell row can be accompanied only by one neighboring gate. For example, the gate Gb is accompanied only by the dummy gate Gb1 on the left side, with no neighboring gate on the other (right) side.

The influence of the optical proximity effects on a gate which is located at an end of a standard cell row and which is accompanied only by one neighboring gate, such as the gate Gb, is greatly different from that on a gate which is accompanied by two or more neighboring gates on each side, such as the gate Ga. Thus, the magnitude of variations in the gate dimensions is greatly different therebetween.

Thus, uniformly performing the correction processes of OPC over the whole semiconductor integrated circuit allows the existence of a gate in which variations in the gate dimensions are not necessarily appropriately corrected, leading to errors in the circuit operations. A conceivable alternative solution is separately performing different corrections of OPC on a gate which is located at an end of a standard cell row and which is accompanied only by one neighboring gate, but this solution undesirably entails an increase in time for correction.

SUMMARY OF THE INVENTION

An objective of the present invention is to provide a semiconductor integrated circuit which entails no increase in the correction time of OPC and in which non-uniformity in the gate lengths due to the optical proximity effects is surely suppressed.

The present invention provides a semiconductor integrated circuit including a gate group which includes a plurality of gate rows, each of the gate rows including gates extended in a first direction and aligned in a second direction which is perpendicular to the first direction, the gate rows being aligned side by side in the first direction, wherein each of the gate rows includes two or more supplementary gates at least one end of the gate row, the supplementary gate being a dummy gate or a gate which is a constituent of an inactive transistor.

According to the present invention, two or more supplementary gates are located at at least one end of each gate row. Therefore, even one of the gates of the active transistors closest to this end is surely accompanied by two or more neighboring gates at the end of the row. Hence, in this gate, deviation in the gate length from a predetermined design value due to the optical proximity effects is suppressed to substantially the same level as the gates of the other active transistors are. Thus, for example, the corrections of OPC are carried out uniformly over the whole semiconductor integrated circuit, whereby the non-uniformity in the gate lengths over the whole semiconductor integrated circuit is appropriately corrected.

The present invention provides a semiconductor integrated circuit including a plurality of standard cell rows located side by side in a first direction, each of the standard cell rows including a plurality of standard cells aligned in a second direction which is perpendicular to the first direction, each of the standard cells including one or more gates extended in the first direction, wherein each of the standard cell rows includes a terminal standard cell at least one end of the standard cell row, the terminal standard cell including two or more supplementary gates, the supplementary gate being a dummy gate or a gate which is a constituent of an inactive transistor.

According to the present invention, each standard cell row includes a terminal standard cell, which includes two or more supplementary gates, at least one end of the standard cell row. Therefore, even one of the gates of the active transistors closest to this end is surely accompanied by two or more neighboring gates at the end of the row. Hence, in this gate, deviation in the gate length due to the optical proximity effects is suppressed to substantially the same level as the gates of the other active transistors are. Thus, for example, the corrections of OPC are carried out uniformly over the whole semiconductor integrated circuit, whereby the non-uniformity in the gate lengths over the whole semiconductor integrated circuit is appropriately corrected.

Thus, according to the present invention, in a semiconductor integrated circuit, as for the gates of all the active transistors which are to be subjected to corrections of the OPC process, the surrounding gate patterns located adjacent to the gates are limited so that the uniformity in the gate lengths can surely be suppressed.

DESCRIPTION OF THE PREFERRED EMBODIMENTS

Hereinafter, embodiments of the present invention will be described in detail with reference to the drawings.

Embodiment 1

Figure 1:
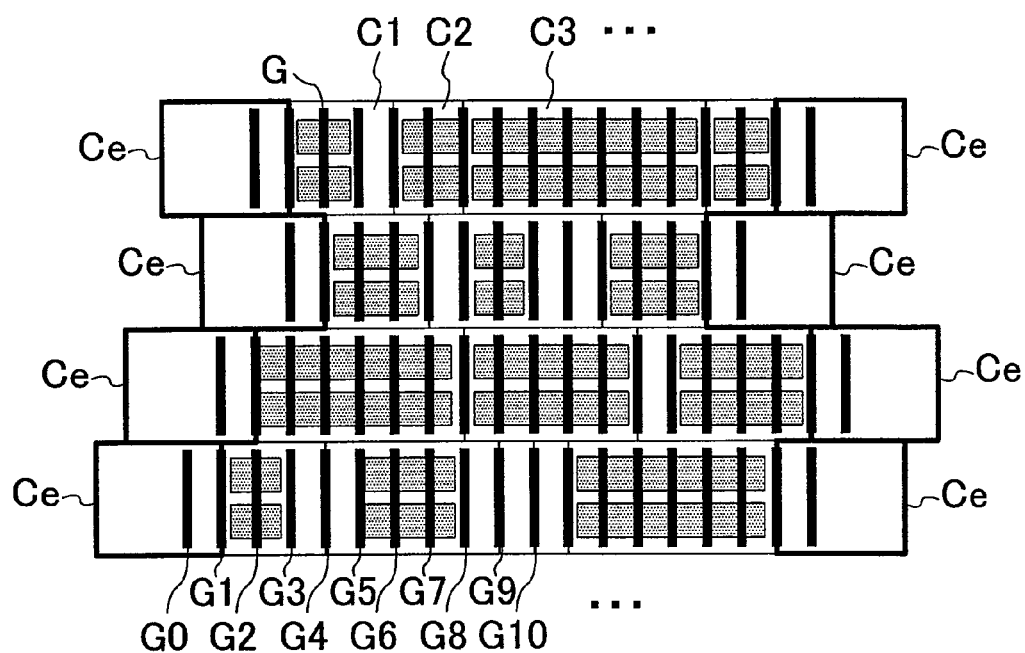
FIG. 1 is a simple illustration of a layout pattern of a semiconductor integrated circuit according to embodiment 1 of the present invention.
Figure 2:
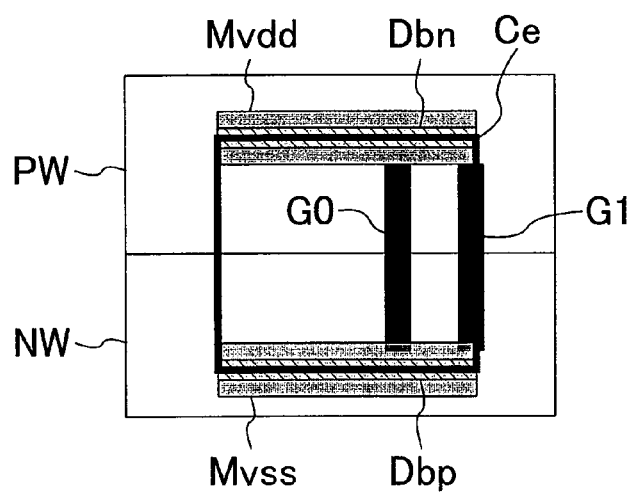
FIG. 2 is a simple illustration of a layout pattern of a terminal standard cell used in the semiconductor integrated circuit of FIG. 1.

FIG. 1 is a simple illustration of a layout pattern of a semiconductor integrated circuit according to embodiment 1 of the present invention. FIG. 2 is a simple illustration of a layout pattern of a standard cell located at an end of a standard cell row (hereinafter, "terminal standard cell") used in the semiconductor integrated circuit of FIG. 1.

In the semiconductor integrated circuit of FIG. 1, standard cells (C1, C2, C3, . . . ) are aligned in the transverse direction (second direction) to form a standard cell row. Each of the standard cells includes one gate G or a plurality of gates G aligned in the transverse direction, the gate G being extended in the vertical direction (first direction). Adjoining standard cells share a dummy gate located at their border. A plurality of such standard cell rows are located side by side in the vertical direction to form a standard cell group.

Located at each of the both ends of each standard cell row is the terminal standard cell Ce of FIG. 2. Referring to FIG. 2, the terminal standard cell Ce features a dummy gate G1 provided as an supplementary gate at the cell border and a dummy gate G0 provided as an supplementary gate adjacent to the dummy gate G1. The other elements of the terminal standard cell Ce include a diffusion region Dbn for supplying the substrate potential to P-type transistors, a diffusion region Dbp for supplying the substrate potential to N-type transistors, a metal line Mvdd for supplying the supply potential to the sources of the P-type transistors, a metal line Mvss for supplying the ground potential to the sources of the N-type transistors, an N-type well NW, and a P-type well PW. The layout of the terminal standard cell Ce of FIG. 2 is for one that is to be located at the left end of the standard cell row. By flipping it from left to right, the layout of FIG. 2 is applicable to the right end of the standard cell row.

In summary, the semiconductor integrated circuit of FIG. 1 includes a gate group which includes a plurality of gate rows, and each of the gate rows includes a plurality of gates aligned in the transverse direction, each of the gates being extended in the vertical direction. At the both ends of each gate row, two or more dummy gates are provided as supplementary gates. Gates G2, G6 and G7 are constituents of active transistors, and gates G0, G1, G3, G4, G5, G8 and G9 are dummy gates. It should be noted that in the semiconductor integrated circuit of FIG. 1 the gates are aligned with equal intervals but may not necessarily be aligned with equal intervals.

With the terminal standard cells Ce, even the gate of one of the active transistors in a standard cell row which is closest to an end of the standard cell row is necessarily accompanied by two or more gates on each side. In the lowermost standard cell row of FIG. 1, for example, the gate G2, which is the leftmost gate of active transistors in the row, is accompanied by the dummy gates G0 and G1 on the left side because of a terminal standard cell Ce1. Thus, the influence of the optical proximity effects on the gate G2 is suppressed to, for example, the level approximately equivalent to the influence of the optical proximity effects on the gate G6 which is a constituent of another active transistor. Therefore, non-uniformity in the gate lengths of the active transistors over the whole semiconductor integrated circuit can be suppressed.

It should be noted that the structure of FIG. 1 includes the terminal standard cells Ce at the both ends of each standard cell row, but any one of the ends of each standard cell row may be provided with the terminal standard cell Ce.

In the present embodiment, the terminal standard cell Ce has two dummy gates but may have three or more dummy gates. The present inventors found that the effect of suppressing non-uniformity in the gate lengths due to the optical proximity effects was sufficiently achieved even with only two dummy gates. In the case of an extra area available for location of still another dummy gate, providing three or more dummy gates is more preferable in view of enhancement of non-uniformity suppression effects.

The supplementary gates located at the ends of a gate row are not limited to the dummy gates but may be gates of inactive transistors which do not contribute to the operation or function of the circuit.

In each gate row, among two or more supplementary gates located at an end of the gate row, it is preferable that the two inner gates have lengths in the vertical direction equal to or greater than the length of the gate of an active transistor adjacent thereto. Thus, the gate of one of the active transistors closest to the end of the gate row is accompanied by two or more neighboring gates which have equal or greater lengths in the vertical direction. Therefore, whatever gate widths the active transistors have, non-uniformity in the gate lengths can be suppressed.

In each gate row, the interval between the two or more supplementary gates located at an end of the gate row is preferably equal to the interval between the innermost supplementary gate and the gate of an active transistor adjacent thereto. With this feature, the gate of one of the active transistors in each gate row which is closest to the end of the gate row and the supplementary gates located adjacent thereto are separated with equal intervals. Thus, non-uniformity in the gate lengths can further be suppressed.

All the gates of the gate group, including the supplementary gates, preferably have an equal size in the vertical direction. All the gates of the gate group, including the supplementary gates, preferably have an equal length in the transverse direction. When these two conditions are satisfied, all the gates including the supplementary gates have an equal gate shape. Thus, non-uniformity in the gate lengths can further be suppressed.

Embodiment 2

Figure 3:
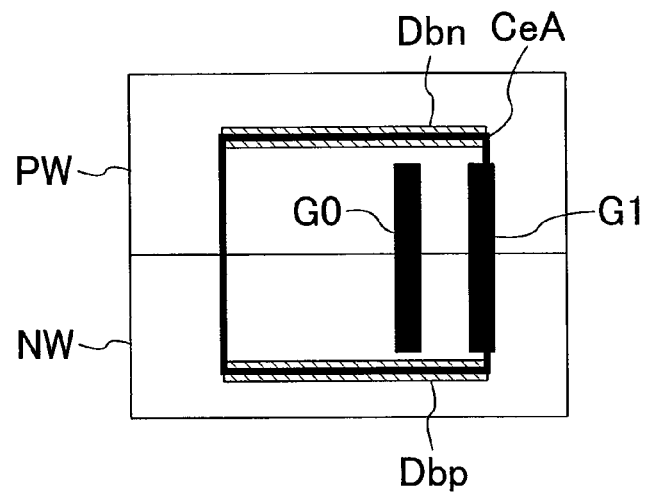
FIG. 3 is a simple illustration of a layout pattern of a terminal standard cell according to embodiment 2 of the present invention.

FIG. 3 is a simple illustration of a layout pattern of a terminal standard cell according to embodiment 2 of the present invention. Even when the terminal standard cell CeA of FIG. 3 is employed in the semiconductor integrated circuit of FIG. 1 in place of the terminal standard cell Ce, the same effects as those of embodiment 1 are achieved, and namely, non-uniformity in the gate lengths of the active transistors over the whole semiconductor integrated circuit can be suppressed.

The terminal standard cell CeA of FIG. 3 is different from the terminal standard cell Ce of FIG. 2 in that the terminal standard cell CeA does not have the metal lines Mvdd and Mvss. With this structure, the metal line resources can be secured while non-uniformity in the gate lengths is suppressed, and the flexibility of circuit designing can be improved. Another conceivable terminal standard cell other than the terminal standard cell of FIG. 3 does not have the diffusion regions Dbn and Dbp. Namely, a terminal standard cell having two or more dummy gates can produce the effect of suppressing non-uniformity in the gate lengths.

Embodiment 3

Figure 4:
FIG. 4 is a simple illustration of a layout pattern of a semiconductor integrated circuit according to embodiment 3 of the present invention.
Figure 5:
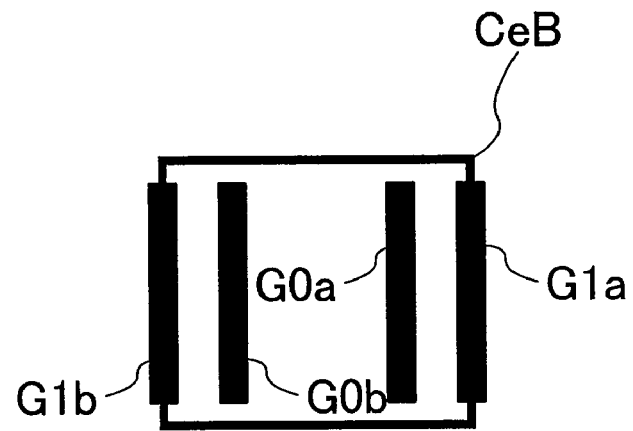
FIG. 5 is a simple illustration of a layout pattern of a terminal standard cell used in the semiconductor integrated circuit of FIG. 4.

FIG. 4 is a simple illustration of a layout pattern of a semiconductor integrated circuit according to embodiment 3 of the present invention. FIG. 5 is a simple illustration of a layout pattern of a terminal standard cell used in the semiconductor integrated circuit of FIG. 4.

In FIG. 4, the terminal standard cells CeB of FIG. 5 are located at the both ends of each standard cell row in place of the terminal standard cells Ce of FIG. 1. The terminal standard cell CeB shown in FIG. 5 has four dummy gates G0$a$, G0$b$, G1$a$ and G1$b$. The dummy gates G1$a$ and G1$b$ (first and second supplementary gates) are located at the both ends with respect to the transverse direction of the terminal standard cell CeB. The dummy gate G0$a$ (third supplementary gate) is adjacent to the dummy gate G1$a$. The dummy gate G0$b$ (fourth supplementary gate) is adjacent to the dummy gate G1$b$. It should be noted that, in FIG. 5, illustration of the diffusion regions Dbn and Dbp, metal lines Mvdd and Mvss, N-type well NW, and P-type well PW is omitted. Alternatively, the terminal standard cell CeB may not actually have any of these elements.

The semiconductor integrated circuit of FIG. 4 has four dummy gates at each of the both ends of each gate row. With this structure, the same effects as those of embodiment 1 are achieved, and namely, non-uniformity in the gate lengths of the active transistors over the whole semiconductor integrated circuit can be suppressed.

When the terminal standard cells of FIG. 2 or FIG. 3 are used, the terminal standard cell designed for location at the left end of the standard cell row need to be flipped from left to right when it is located at the right end. In contrast, the terminal standard cell CeB of FIG. 5 has two dummy gates near each of the left and right cell borders. Therefore, the terminal standard cell CeB can be located at any of the left and right ends of the standard cell row without being flipped. Thus, layout designing of the semiconductor integrated circuit can be simplified.

Figure 6:
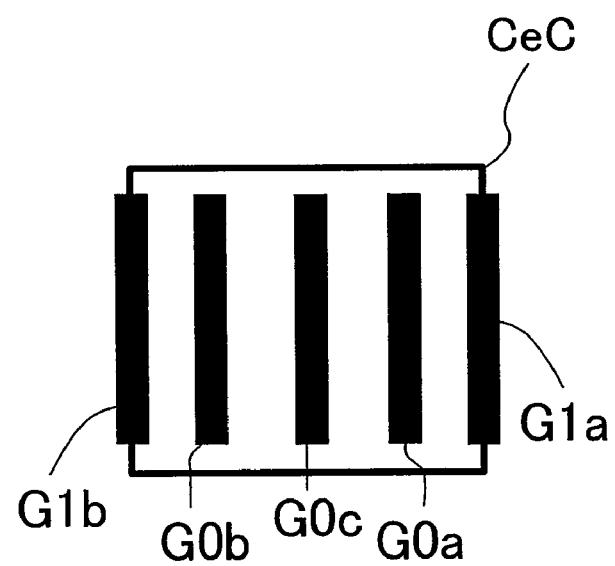
FIG. 6 is a simple illustration of another layout pattern example of the terminal standard cell according to embodiment 3 of the present invention.
Figure 7:
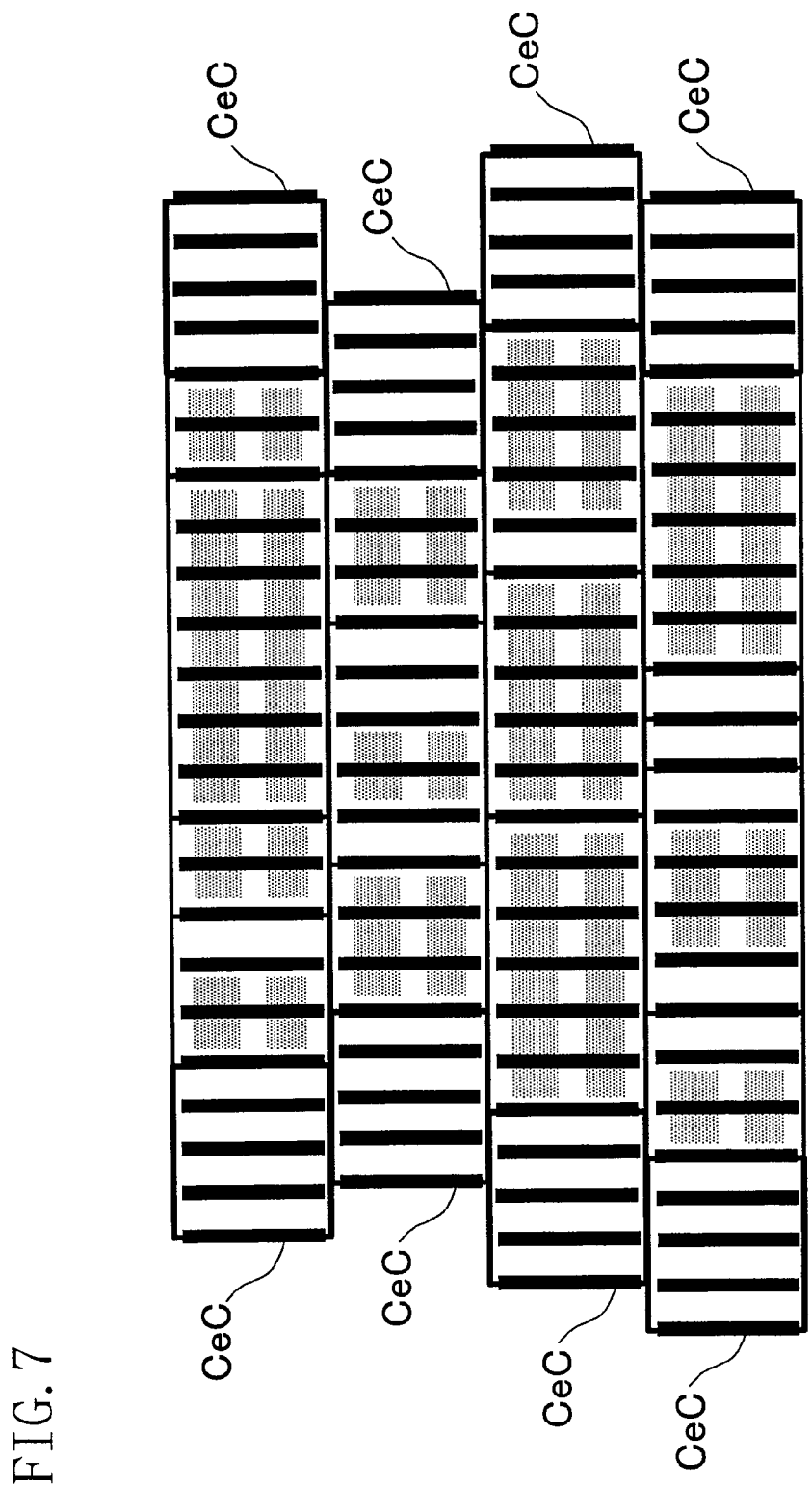
FIG. 7 is a simple illustration of a layout pattern of a semiconductor integrated circuit designed using the terminal standard cell of FIG. 6.

FIG. 6 is a simple illustration of another layout pattern example of the terminal standard cell according to this embodiment. FIG. 7 is a simple illustration of a layout pattern of a semiconductor integrated circuit designed using the terminal standard cell of FIG. 6. The terminal standard cell CeC of FIG. 6 includes a dummy gate G0$c$ in addition to the components of the terminal standard cell CeB of FIG. 5, namely, five dummy gates in total. The example with the terminal standard cell CeC also achieves the same effects as those achieved when the terminal standard cell CeB of FIG. 5 is used.

Embodiment 4

Figure 8:
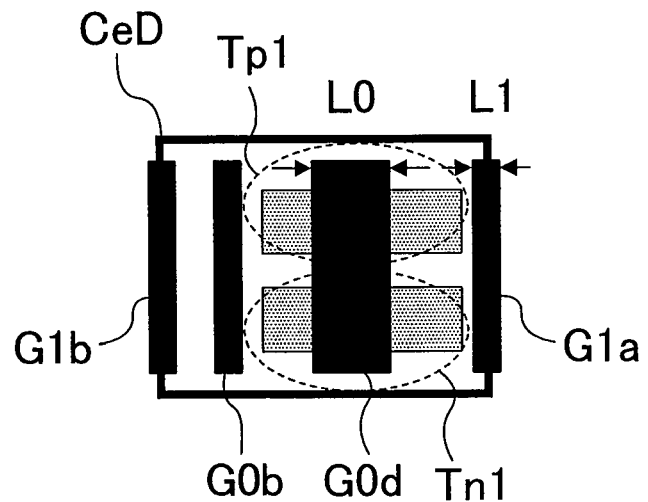
FIG. 8 is a simple illustration of a layout pattern of a terminal standard cell according to embodiment 4 of the present invention.

FIG. 8 is a simple illustration of a layout pattern of a terminal standard cell according to embodiment 4 of the present invention. The terminal standard cell CeD shown in FIG. 8 has a gate G0d in addition to the three dummy gate G0b, G1a and G1b. The gate G0d and the diffusion regions form transistors Tp1 and Tn1. The transistors Tp1 and Tn1 are transistors which constitute the capacitance and are also inactive transistors. It should be noted that, in FIG. 8, illustration of the diffusion regions Dbn and Dbp, metal lines Mvdd and Mvss, N-type well NW, and P-type well PW is omitted. Alternatively, the terminal standard cell CeD may not actually have any of these elements.

Even when the terminal standard cell CeD of FIG. 8 is employed in the semiconductor integrated circuit of FIG. 1 in place of the terminal standard cells Ce, the same effects as those of embodiment 1 are achieved, and namely, non-uniformity in the gate lengths of the active transistors over the whole semiconductor integrated circuit can be suppressed. The terminal standard cell CeD of FIG. 8 includes the transistors Tp1 and Tn1 which constitute the capacitance and, therefore, can also serve as a decoupling capacitance standard cell between power supplies.

It should be noted herein that, if gate length L0 of the gate G0d which is a constituent of the transistors Tp1 and Tn1 is greater than gate length L1 of the adjacent gate G1a, there is a probability that non-uniformity in the gate lengths of active transistors included in a standard cell adjacent to the terminal standard cell CeD is adversely affected.

Figure 9:
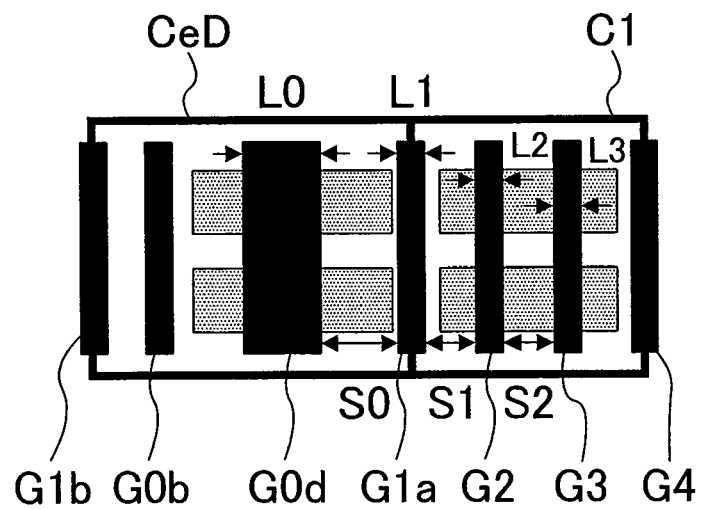
FIG. 9 is a simple illustration of a layout pattern example where the terminal standard cell of FIG. 8 is adjacent to another standard cell.

FIG. 9 is a simple illustration of a layout pattern example where the terminal standard cell CeD of FIG. 8 is adjacent to the standard cell C1 in the semiconductor integrated circuit. Referring to FIG. 9, as for the gate G3 of the active transistor, for example, gate length L3 of the gate G3 is equal to gate lengths L1 and L2 of the two adjacent gates G1a and G2, and gate intervals S1 and S2 of these gates are equal. With this structure, deviation in gate length L3 from a predetermined design value can be sufficiently minimized. However, as for the gate G2 of the active transistor, the second closest gate on the left side, i.e., the gate G0d, has longer gate length L0, and therefore, there is a probability that deviation in gate length L2 from a predetermined design value cannot be sufficiently suppressed.

A countermeasure to this undesirable probability is securing, for a gate having a greater length, a slightly longer interval between the gate and an adjoining gate. With this arrangement, increase in deviation which is attributed to the greater gate length can be prevented. For example, in the example of FIG. 9, gate interval S0 is greater than gate intervals S1 and S2, and therefore, the adverse effects on deviation in the gate length of the gate G2 which would be attributed to the gate G0a having greater gate length L0 can be prevented. With such a countermeasure, the gate length deviation suppressing effect can be sufficiently achieved even when a terminal standard cell which includes a capacitance transistor is used.

It should be noted herein that the terminal standard cell which also has another function is a standard cell including a transistor which forms the capacitance as described above, but it may be, for example, a standard cell including a transistor which has a supply potential fixing function, a standard cell including a diode which serves as the means of dissipating the charge for the purpose of avoiding breakage of a gate dielectric film, or a standard cell including an off-transistor.

Embodiment 5

Figure 10:
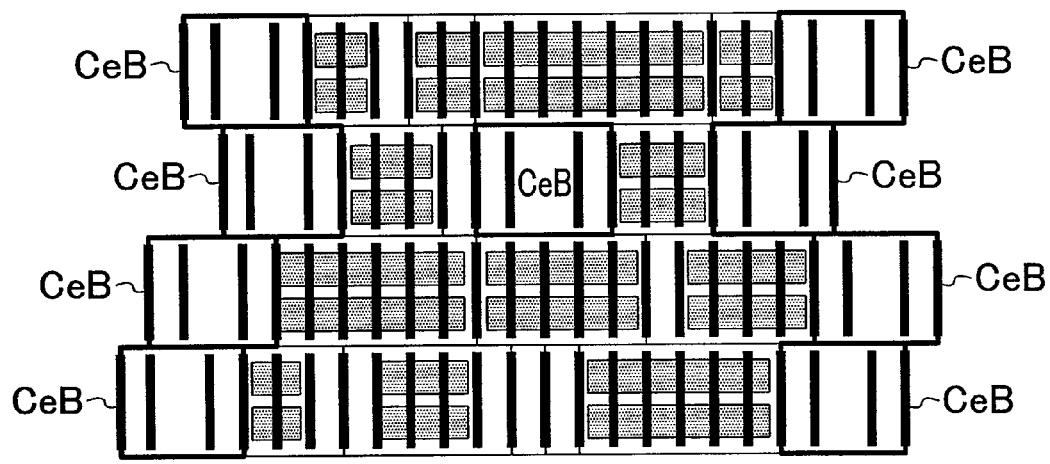
FIG. 10 is a simple illustration of a layout pattern of a semiconductor integrated circuit according to embodiment 5 of the present invention.

FIG. 10 is a simple illustration of a layout pattern of a semiconductor integrated circuit according to embodiment 5 of the present invention. The semiconductor integrated circuit of FIG. 10 is substantially the same as that of FIG. 4 except that the terminal standard cells CeB are located at positions other than the both ends of the standard cell rows. Referring to FIG. 10, one of the terminal standard cells CeB is located in the midst of a standard cell row but provides no adverse effects on adjoining standard cells. Therefore, the terminal standard cell can be employed in the layout designing of the semiconductor integrated circuit.

The other designs of terminal standard cells, such as the terminal standard cells Ce and CeA shown in FIG. 2 and FIG. 3, may also be located at positions other than the both ends of the standard cell rows.

Embodiment 6

Figure 11:
FIG. 11 is a simple illustration of a layout pattern of a semiconductor integrated circuit according to embodiment 6 of the present invention.

FIG. 11 is a simple illustration of a layout pattern of a semiconductor integrated circuit according to embodiment 6 of the present invention. The semiconductor integrated circuit of FIG. 11 is substantially the same as that of FIG. 1 except that the terminal standard cell CeD of FIG. 8 is located on the left side of each of the first and fourth standard cell rows. Namely, the semiconductor integrated circuit of FIG. 11 includes the terminal standard cells having different structures together. Even when such terminal standard cells having different structures are provided together, the non-uniformity in the gate lengths can be suppressed as in the above-described embodiments.

Embodiment 7

Figure 12:
FIG. 12 is a simple illustration of a layout pattern of a semiconductor integrated circuit according to embodiment 7 of the present invention.

FIG. 12 is a simple illustration of a layout pattern of a semiconductor integrated circuit according to embodiment 7 of the present invention. The semiconductor integrated circuit of FIG. 12 is substantially the same as that of FIG. 4 except that the terminal standard cells CeB at the both ends of the respective standard cell rows are aligned in the vertical direction. Namely, the terminal standard cells CeB are located at equivalent positions with respect to the transverse direction of the circuit. Rephrasing in view of the gate groups, the dummy gates at the both ends of the respective gate rows are located at equivalent positions with respect to the transverse direction of the circuit so that they are aligned in the vertical direction.

Thus, the layout region of the semiconductor integrated circuit can be rectangular. Therefore, the affinity with layout regions of the other semiconductor integrated circuits can be improved, and the layout of a larger scale semiconductor integrated circuit can be designed more readily.

Embodiment 8

Figure 13:
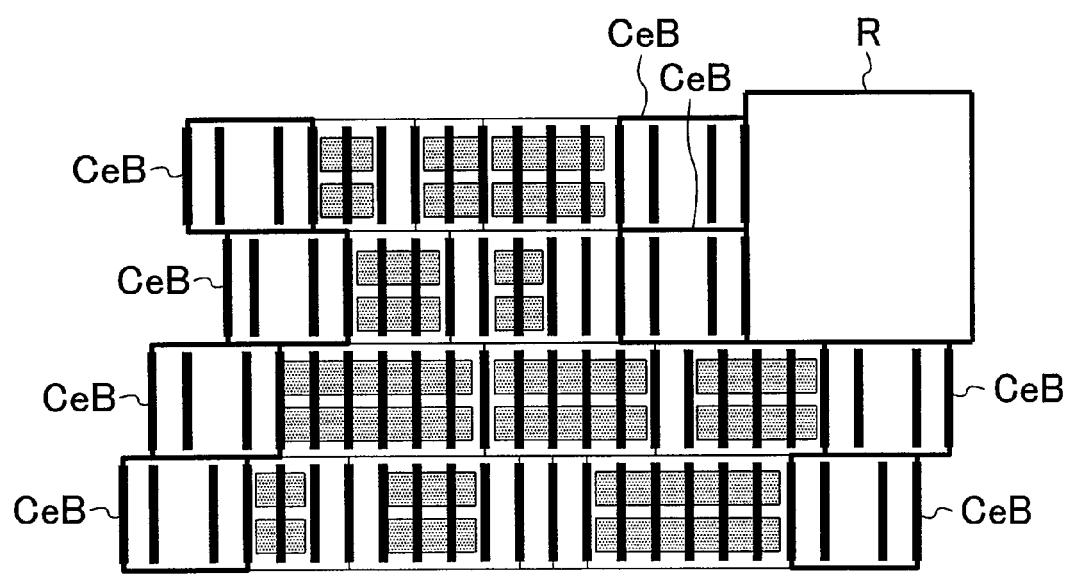
FIG. 13 is a simple illustration of a layout pattern of a semiconductor integrated circuit according to embodiment 8 of the present invention.

FIG. 13 is a simple illustration of a layout pattern of a semiconductor integrated circuit according to embodiment 8 of the present invention. The semiconductor integrated circuit of FIG. 13 includes a macro cell R which is designed based on different layout specifications from those used in designing the standard cell rows. At the borders between the macro cell R and the standard cell rows, the terminal standard cells CeB are located for the purpose of suppressing non-uniformity in the gate lengths in the standard cells.

Figure 14:
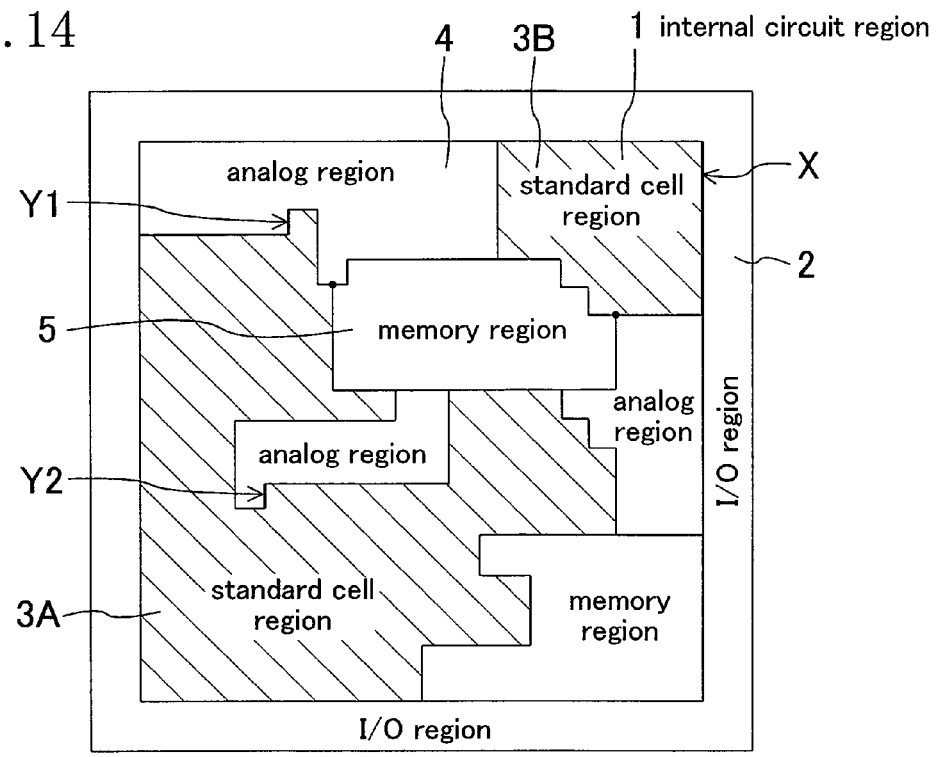
FIG. 14 shows a layout example of the semiconductor integrated circuit.
Figure 15:
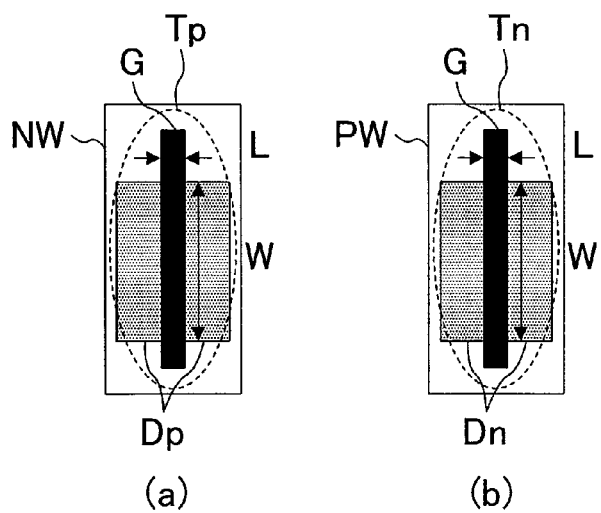
FIG. 15A and FIG. 15B are simple illustrations of typical transistor layout pattern examples.
Figure 16:
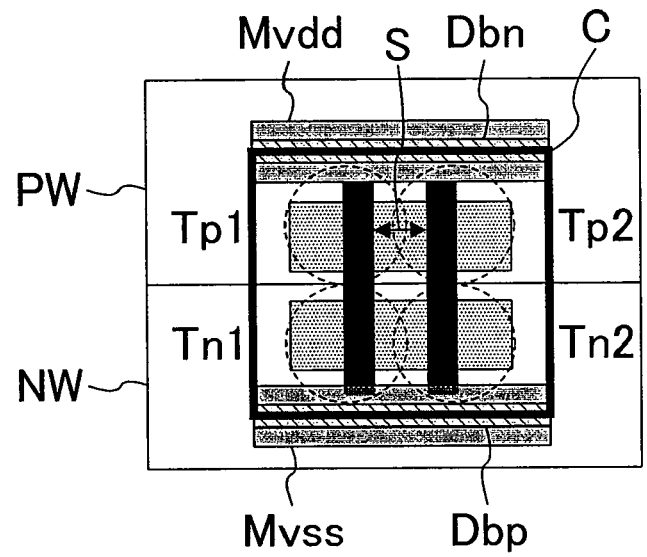
FIG. 16 is a simple illustration of a standard cell layout pattern.
Figure 17:
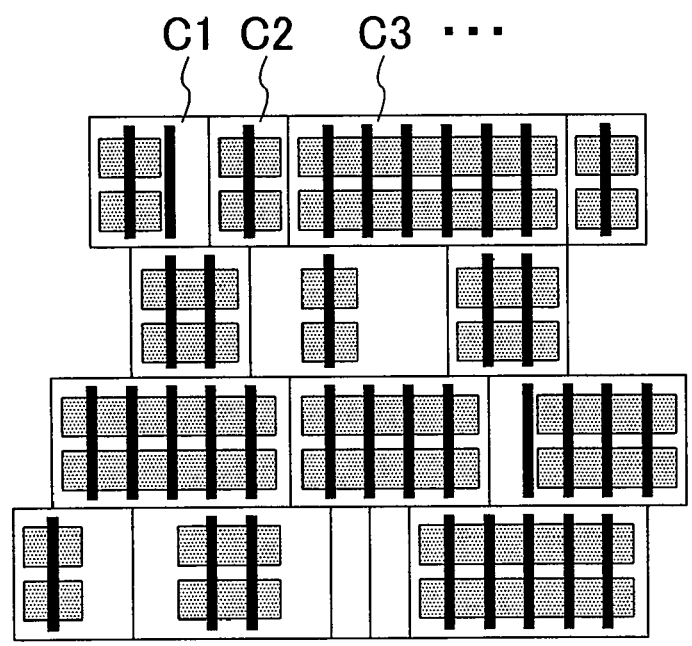
FIG. 17 is a simple illustration of a layout pattern example of a conventional semiconductor integrated circuit designed using such standard cells as shown in FIG. 16.
Figure 18:
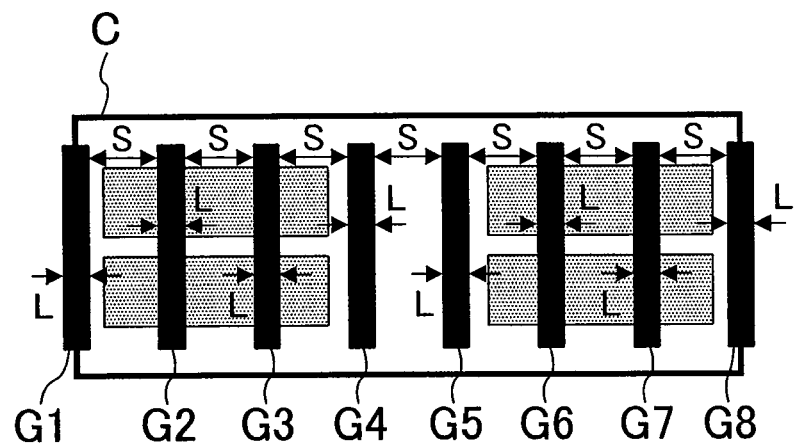
FIG. 18 is a simple illustration of a layout pattern of a standard cell with uniform gate lengths and gate intervals.
Figure 19:
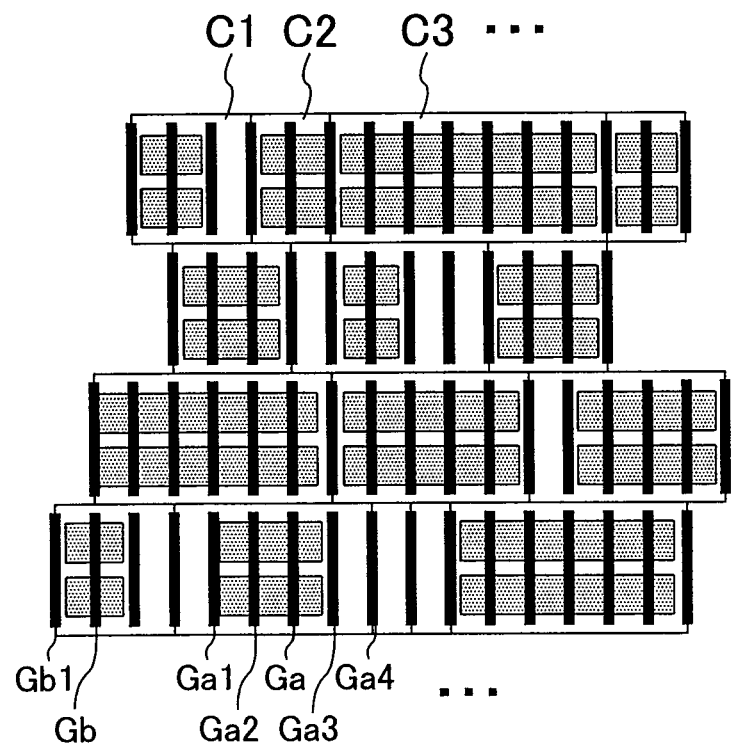
FIG. 19 is a simple illustration of a layout pattern of a conventional semiconductor integrated circuit which is designed using such standard cells as shown in FIG. 18.

FIG. 14 shows a layout example of the semiconductor integrated circuit. Referring to FIG. 14, the typical semiconductor integrated circuit separately includes an internal circuit region 1 and an I/O region 2. The internal circuit region 1 includes an analog region 4 and a memory region 5 in addition to standard cell regions 3A and 3B. It should be noted that the standard cell regions are formed only by standard cells, and the memory region and analog regions, for example, are not formed by standard cells and therefore do not fall within the standard cell regions.

The gate groups described in the above embodiments are within the standard cell regions 3A and 3B such that the respective gate rows are aligned in the transverse direction. For example, two or more supplementary gates located at an end of a gate row are aligned along the vertically-extending border edges Y1 and Y2 of the standard cell region 3A. It should be noted that an arrangement where supplementary gates are aligned along at least one of the vertically-extending border edges of a standard cell region is within the scope of the present invention. As a matter of course, two or more supplementary gates may be aligned along every one of the vertically-extending border edges of a standard cell region.

Also, two or more supplementary gates are aligned at the end of a gate row along the vertically-extending border edge X of the standard cell region 3B. The border edge X extends along one of the border edges of the internal circuit region 1 which includes the standard cell region 3B.

The present invention is applicable to a semiconductor integrated circuit, or the like, which is incorporated in various electronic devices.

What is claimed is:

1. A semiconductor integrated circuit, comprising:
   a gate group which includes a plurality of gate rows, each of the gate rows including gates extending in a first direction and aligned in a second direction which is perpendicular to the first direction, the gate rows being aligned side by side in the first direction, wherein:
   the gate group includes a supplementary gate group provided adjacently in the second direction to an end of each of the gate rows,
   the supplementary gate group includes two or more supplementary gates extending in the first direction and aligned side by side in the second direction,
   each of the supplementary gates is a dummy gate or a gate which is a constituent of an inactive transistor,
   the supplementary gate group does not include a gate of an active transistor; and
   a transistor which constitutes a capacitor is further disposed adjacent to the supplementary gate group.

2. The semiconductor integrated circuit of claim 1, wherein the supplementary gate group is provided adjacently in the second direction to both ends of each of the gate rows.

3. The semiconductor integrated circuit of claim 1, wherein the supplementary gate group includes four supplementary gates.

4. The semiconductor integrated circuit of claim 1, wherein:
   the gate group is located in a standard cell region; and
   two or more supplementary gate groups are provided with being aligned along at least one of border edges of the standard cell region extending in the first direction.

5. The semiconductor integrated circuit of claim 4, wherein the two or more supplementary gate groups are aligned along every one of the border edges of the standard cell region extending in the first direction.

6. The semiconductor integrated circuit of claim 4, wherein the at least one of the border edges of the standard cell region along which the two or more supplementary gate groups are aligned extends along a border edge of an internal circuit region which includes the standard cell region.

7. The semiconductor integrated circuit of claim 1 wherein, two inner gates included in the supplementary gate group have lengths in the first direction equal to or greater than a length in the first direction of a gate of an active transistor adjacent to the supplementary gate group.

8. The semiconductor integrated circuit of claim 1, wherein an interval between the supplementary gates included in the supplementary gate group is equal to an interval between an innermost one of the supplementary gates included in the supplementary gate group and a gate of an active transistor adjacent to the innermost gate.

9. The semiconductor integrated circuit of claim 1, wherein all the gates of the gate group including the supplementary gate group have an equal length in the first direction.

10. The semiconductor integrated circuit of claim 1, wherein all the gates of the gate group including the supplementary gate group have an equal length in the second direction on a layout design.

11. The semiconductor integrated circuit of claim 1, wherein two or more supplementary gates are located at equivalent positions with respect to the second direction.

12. A semiconductor integrated circuit, comprising:
    a gate group which includes a plurality of gate rows, each of the gate rows including gate patterns extending in a first direction and aligned only in a second direction perpendicular to the first direction, the gate rows being aligned side by side in the first direction, wherein
    two or more outermost gate patterns of at least one end of at least one of the gate rows are a dummy gate pattern or a gate pattern of an inactive transistor; and
    a transistor which constitutes a capacitor is further disposed adjacent to the two or more outermost gate patterns.

13. The semiconductor integrated circuit of claim 12, wherein
    two or more outermost gate patterns of both ends of at least one of the gate rows are a dummy gate pattern or a gate pattern of an inactive transistor.

14. The semiconductor integrated circuit of claim 13, wherein
    two or more outermost gate pattern of both ends of the plurality of gate rows are a dummy gate pattern or a gate pattern of an inactive transistor.

15. The semiconductor integrated circuit of claim 12, wherein
    four outermost gate pattern of at least one end of at least one of the gate rows are a dummy gate pattern or a gate pattern of an inactive transistor.

16. The semiconductor integrated circuit of claim 12, wherein the gate patterns are aligned with a constant interval in the second direction.

* * * * *